US008949757B2

(12) United States Patent
Oktem

(10) Patent No.: US 8,949,757 B2
(45) Date of Patent: Feb. 3, 2015

(54) CIRCUIT DESIGN AND RETIMING

(71) Applicant: Synopsys, Inc., Mountain View, CA (US)

(72) Inventor: Levent Oktem, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/868,096

(22) Filed: Apr. 22, 2013

(65) Prior Publication Data

US 2013/0239081 A1 Sep. 12, 2013

Related U.S. Application Data

(60) Continuation of application No. 12/432,446, filed on Apr. 29, 2009, now Pat. No. 8,429,583, which is a division of application No. 11/605,554, filed on Nov. 27, 2006, now Pat. No. 7,802,213, which is a division of application No. 10/435,061, filed on May 9, 2003, now Pat. No. 7,162,704.

(51) Int. Cl.
G06F 17/50 (2006.01)
(52) U.S. Cl.
CPC .......... *G06F 17/5059* (2013.01); *G06F 17/505* (2013.01)
USPC ........................................... 716/113; 716/126
(58) Field of Classification Search
CPC ................................ G06F 17/50; G06F 9/455
USPC .................................................. 716/113, 126
See application file for complete search history.

(56) References Cited

U.S. PATENT DOCUMENTS

| 5,898,742 A | 4/1999 | Van Der Werf |
| 5,937,190 A | 8/1999 | Gregory et al. |

(Continued)

FOREIGN PATENT DOCUMENTS

| EP | 0769738 A2 | 4/1997 |
| JP | 11-73449 | 3/1999 |

(Continued)

OTHER PUBLICATIONS

Gebotys, C.H. et al. "Optimal Mapping of DSP Applications to Architectures," System Sciences, Proceedings of the 26th Hawaii International Conference, Wailea, HI (Jan. 5-8, 1993), pp. 116-123.

(Continued)

*Primary Examiner* — Thuan Do
(74) *Attorney, Agent, or Firm* — HIPLegal LLP; Judith A. Szepesi

(57) ABSTRACT

A method and apparatus to design a circuit is described. In on embodiment, the method comprises selecting a target clock for a design of the circuit, and determining a plurality of latencies for a portion of the circuit. The method further comprises determining a representation of a data flow graph for the portion of the circuit, the data flow graph having a first node connected with a second node by a number of extra delays determined based on the target clock and the plurality of latencies, the first node and second node representing paths that start from and end in registers in the portion of the circuit, the first node connecting to a node between a first input of the portion of the circuit and an input of a register of the portion of the circuit. The method continues to retime the design for the circuit to operate at the target clock based on the representation of the data flow graph, wherein at least one of the selecting, determining, and retiming is performed by a processor.

17 Claims, 23 Drawing Sheets

(56) References Cited

U.S. PATENT DOCUMENTS

| | | | |
|---|---|---|---|
| 6,292,926 | B1 | 9/2001 | Fukui et al. |
| 6,647,540 | B2 * | 11/2003 | Lindkvist et al. ............. 716/108 |
| 6,915,361 | B2 * | 7/2005 | Alpert et al. .................... 710/52 |
| 7,162,704 | B2 | 1/2007 | Oktem |
| 7,296,246 | B1 | 11/2007 | Kuehlmann et al. |
| 2004/0068708 | A1 | 4/2004 | Sivaraman et al. |
| 2005/0132316 | A1 | 6/2005 | Suaris et al. |

FOREIGN PATENT DOCUMENTS

| | | |
|---|---|---|
| JP | 11-154167 | 6/1999 |
| JP | 2000-348878 | 12/2000 |
| WO | WO 2004/102429 A2 | 11/2004 |

OTHER PUBLICATIONS

Kuehlmann, A. et al. "Timing Analysis in High-Level Synthesis," Proceedings of the IEEE/ACM International Conference on Computer Aided Design (ICCAD), Santa Clara, CA (Nov. 8-12, 1992), pp. 349-354.

Ochi, Hiroyuki, et al, "Development of IP Library of IEEE754 Std Single-Precision Floating-Point Dividers," The Institute of Electronics, Information and Communication Engineers, Technical Report of IEICE, VLD2002-116, ICD2002-160, DC2002-68 (Nov. 2002), 7 pages (English Abstract).

Parhi, Keshab K. "VLSI Digital Signal Processing Systems: Design and Implementation," Wiley-Interscience (1999), pp. 43-45 and 91-118.

PCT International Preliminary Report for PCT International Appln. No. US2004/014225, mailed Nov. 24, 2005 (9 pages).

PCT International Search Report and Written Opinion for PCT International Appln. No. US2004/014225, mailed Oct. 10, 2005 (15 pages).

European Patent Application No. 04751567.1, Official Action mailed Feb. 24, 2009, 5 pages.

Japanese Patent Application No. 2006-532839, Official Action dated Jul. 14, 2009, 10 pages.

Japanese Patent Application No. 2006-532839, Official Action mailed Dec. 22, 2009, 3 pages (English translation).

Kawata, Yoko et al., "An Algorithm for Generating Data Flow Graphs from Behavioral Descriptions," Journal of Information Processing Society of Japan, Oct. 20, 1995, vol. 95, No. 99 (DA-77), pp. 137-144.

\* cited by examiner

CIRCUIT DESIGN AND RETIMING

This application is a continuation of U.S. patent application Ser. No. 12/432,446, filed on Apr. 29, 2009, U.S. Pat. No. 8,429,583, issuing on Apr. 23, 2013, which is a divisional of U.S. patent application Ser. No. 11/605,554, filed on Nov. 27, 2006, now U.S. Pat. No. 7,802,213, issued on Sep. 21, 2010, which is a divisional of U.S. patent application Ser. No. 10/435,061, filed on May 9, 2003, now issued as U.S. Pat. No. 7,162,704, issued on Jan. 9, 2007.

FIELD OF THE INVENTION

The invention relates to circuit design, and more particularly to the modeling of the timing behavior of circuit modules in circuit design.

BACKGROUND

For the design of digital circuits (e.g., on the scale of Very Large Scale Integration (VLSI) technology), designers often employ computer aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

Retiming algorithms have been used to optimize a design of a circuit. Typically, a synchronous circuit works properly only when a signal propagates from one register to another along a combinational path, a path that does not include a register, such as a memory cell, a flip-flop, a delay element, etc., within a specified number of clock cycles (e.g., in one clock period). Thus, the maximum signal delay on the paths between the registers (e.g., due to the computation time of the combinational computing elements on a path and the wire delays) determines the minimum clock period in which the circuit can work properly. Registers may be placed or repositioned on a path of the circuit to reduce the maximum signal delay on the path and to reduce the clock period of the circuit. A general retiming algorithm may be used to redistribute some of the registers in the circuit, based on a timing model of the circuit to minimize the clock period.

Typically, the timing model of a circuit is obtained by putting together the timing models of the combinational computation units, delays (e.g., due to the registers), and interconnections that make up the circuit. Interconnect delays are hard to model and thus often ignored. A typical timing model for a circuit system that includes one or more circuit modules is generated from aggregating the timing models of the combinational computation units of the modules.

Typical retiming algorithms (e.g., described in "VLSI Digital Signal Processing Systems: Design and Implementation" by Keshab K. Parhi, pp. 91-118, Wiley-Interscience, 1999) are formulated based on data flow graphs. Data flow graphs are composed of nodes that represent the combinational computation units and edges interconnecting them. Delays (e.g. registers) are represented as weights on the edges. Each node has an execution time associated with it.

For example, FIGS. 2-3 illustrate a prior art method to construct a data flow graph for retiming. The combinational computation units (e.g., adder 205, multipliers 207 and 209) in FIG. 2 are represented as computation nodes (e.g., nodes 225, 227 and 229 in FIG. 3). Execution time at the combinational computation units is represented by the computation time of the nodes. For example, node 225 has a computation time of 2 ns, which is required by adder 205; and each of nodes 227 and 229 has a computation time of 4 ns, which is required by a multiplier (e.g., 209 or 207). Edge 231 represents the connection between multiplier 207 and adder 205. Edge 231 has a weight of 1, representing register 217 (or the one clock cycle latency due to register 217). Similarly, edge 233 has one delay representing register 215. Edge 235 represents the connection between multipliers 209 and 207; and, there is no delay associated with edge 235.

A critical path in a data flow graph is the path with the longest computation time among all paths that contain zero delay edges (combinatorial paths). For example, in FIG. 3, the path from node 229 to node 227 contains edge 235 that has zero delay; and, the path from node 229 to node 227 takes the longest computation time (e.g., 8 ns, of which 4 ns are for node 229 and 4 ns for node 227). Thus, the minimum clock period for the circuit in FIG. 2 is 8 ns. In FIG. 3, the delay on edge 233 can be moved to edge 235 so that the critical path becomes the path between nodes 225 and 229, which takes only 6 ns of computation time. Thus, moving the delay from edge 233 to edge 235, which can be implemented by moving register 215 from between adder 205 and multiplier 209 to between multipliers 209 and 207, allows the modified (retimed) circuit to be operated at a reduced clock period of 6 ns.

The conventional approach for obtaining the timing model for a circuit module is breaking down the module into the actual registers and combinational computing elements that make up the module and assigning one node to each combinational computing element. Typically, circuit modules in a design are translated into a set of nodes and edges that correspond to the combinational units in the modules and the nets connecting them. In other words, the timing model of each hardware module is typically constructed by putting together the timing models of the combinational computation units, delays, and interconnections that make up the hardware module. The aggregation of the set of nodes and edges used in the translation of a particular hardware module is effectively the timing model (data flow graph) of that hardware module.

Retiming algorithms include cutset retiming and pipelining. Further, there exist retiming algorithms for clock period minimization using the data flow graph. More details about the cutset retiming, pipelining and retiming for clock period minimization can be found in the literature (e.g., "VLSI Digital Signal Processing Systems: Design and Implementation" by Keshab K. Parhi, pp. 97-106, Wiley-Interscience, 1999).

SUMMARY OF THE DESCRIPTION

Methods and apparatuses to hierarchically retime a circuit are described here. Some embodiments of the present inventions are summarized in this section.

In at least one embodiment of the present invention, a module of a circuit is designed with a plurality of different latencies to have a plurality of different minimum clock periods (e.g., through retiming at the module level). In one example, the minimum clock periods are determined from detailed timing analyses after the placement and routing for the module; and, in retiming the circuit that contains the module, a data flow graph representation of the module is constructed based on the target clock period of the circuit and the correlation between the latencies and the minimum clock periods. In at least one embodiment of the present invention, hierarchical retiming is performed in which portions of the circuit is retimed to generate results (e.g., for different latencies), which are selectively used for the retiming of the entire circuit based on the target clock period.

In one embodiment of the present invention, a method to design a circuit module includes: generating a plurality of circuit designs for a module, which corresponds to the module with a plurality of different latencies; determining a plurality of admissible clocks (e.g., minimum clock periods) for the plurality of circuit designs to represent the feasible clock periods for the plurality of circuit designs; and, generating design data to relate the plurality of admissible clocks with the plurality of different latencies. In one example, placement and routing are performed to generate each of the plurality of circuit designs; and, the admissible clocks are determined from detailed timing analyses based on the design layout. In one example, after a first one of the plurality of circuit designs is generated, a pipeline register set is inserted into the first one of the plurality of circuit designs to generate a second one of the plurality of circuit designs; and, retiming is further performed to generate the second one of the plurality of circuit designs. In one example, a first one of the plurality of circuit designs and a second one of the plurality of circuit designs have different architectures (e.g., having different processing logic or different logic processing elements). In one example, the design data further relates the plurality of different latencies with one or more data flow graph representations of the plurality of the circuit designs based on the plurality of admissible clocks. In one example, one or more data flow graph representations of the module are generated to represent the plurality of circuit designs based on the plurality of admissible clocks. For example, when a first one of the plurality of circuit designs includes a non-registered input, the one or more data flow graph representations include a representation of a computation node that represents at least a portion of signal delay on a first path in the first one of the plurality of circuit designs, where the first path contains no register and connects to the non-registered input; for example, the computation node represents the signal delay on the first path that is not smaller than signal delay on any path that contains no register and that connects between the non-registered input and a register in the first one of the plurality of circuit designs. Similarly, for example, when a first one of the plurality of circuit designs includes a non-registered output, the one or more data flow graph representations include a representation of a computation node that represents at least a portion of signal delay on a first path on the first one of the plurality of circuit designs, where the first path contains no register and connects to the non-registered output; and, for example, the computation node represents the signal delay on the first path that is not smaller than signal delay on any path that contains no register and that connects between the non-registered output and a register in the first one of the plurality of circuit designs. A computation node can also be used to represent the signal delay on the first path that is not smaller than signal delay on any path that contains no register and that connects the non-registered input and output in the first one of the plurality of circuit designs. In one example, a first graph representation of the one or more data flow graph representations corresponds to a first one of the plurality of circuit designs; the first graph representation includes an edge representing all first paths which start from and end in registers in the first one of the plurality of circuit designs; and, delay on the edge relates to a latency for the first one of the plurality of circuit designs. In one example, the edge connects a first node and a second node to represent the first paths, where the first node and the second nodes cause no signal delay.

In one embodiment of the present invention, a method to design a circuit includes: selecting a target clock for a design of the circuit; determining a representation of a data flow graph for a portion of the circuit based on the target clock; and retiming the design for the target clock using the representation of the data flow graph. In one example, a number of extra delays required on an edge of the data flow graph is determined based on the target clock in determining the representation of the data flow graph. In one example, the edge connects a first node and a second node of the data flow graph; the first and second nodes connected by the edge represent the paths that start from and end in registers in the portion of the circuit; the first node connects to a node that represents signal delay which is not smaller than signal delay on any path that contains no registers and that is between a first input of the portion of the circuit and an input of a register of the portion of the circuit; the second node connects to a node that represents signal delay which is not smaller than signal delay on any path that contains no registers and that is between a first output of the portion of the circuit and an output of a register of the portion of the circuit; and, the data flow graph comprises a node that represents signal delay which is not smaller than signal delay on any path that contains no registers and that connects one input of the portion of the circuit to one output of the portion of the circuit. In one example, retiming is performed on the portion of the circuit according to the target clock in determining the number of extra delays. In one example, the number of extra delays is determined from design data that correlates the numbers of extra delays with admissible clocks for the portion of the circuit.

In one embodiment of the present invention, a method to design a circuit includes: selecting a target clock for a design of the circuit; retiming a portion of the design of the circuit for the target clock to generate a first result; and retiming the design for the target clock using the first result. In one example, retiming the portion of the design of the circuit includes adding (or removing) a number of pipeline register sets to the portion of the design so that the portion of the design is capable of running at the target clock; and, retiming the design for the target clock includes representing, using a connection, all paths between registers of the portion of the design that is retimed, where the connection requires a number of additional delays that represent the number of pipeline register sets added to the portion of the design. In one example, the connection connects a first node and a second node, where the first and second nodes cause no signal delay. In one example, retiming the design for the target clock further includes: representing, using an input computing node, the maximum signal delay along all paths that contain no register and that connect a first input of the portion of the design and a register of the portion of the design, where the input computing node is connected to the first node through a connection of no delay; representing, using an output computing node, the maximum signal delay along all paths that contain no register and that connect a first output of the portion of the design and a register of the portion of the design, where the output computing node is connected to the second node through a connection of no delay; and, representing, using a first computing node, the maximum signal delay along all paths that contain no register and that connect a second input of the portion of the design and a second output of the portion of the design.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to an or one embodiment in the present disclosure are not necessary to the same embodiment; and, such references means at least one.

At least one embodiment of the present invention seeks to use a hierarchical method to retime a circuit design, in which a portion of the circuit (e.g., a circuit module or a circuit block) is retimed for clock period minimization and the entire circuit is retimed based on the result of the retiming of the portion of the circuit. In one embodiment of the present invention, a parametric design of a module is obtained to establish a timing model of the module; and, the timing model is used in retiming the entire circuit.

In the present description and in the claims, a register refers to a sequential element in general (e.g., a delay element, a memory cell, a flip-flop, or others). A register samples and holds (stores) the input signal so that it can be output in synchronization with the clock of the circuit. Further, it is understood that one delay on an edge of a data flow graph represents a unit of latency typically introduced by the presence of a register on the corresponding path. However, the unit of latency can also be implemented through other means, such as different control signals for reading a memory cell.

Many of the methods of the present invention may be performed with a digital processing system, such as a conventional, general-purpose computer system. Special purpose computers, which are designed or programmed to perform only one function, may also be used.

Figure 1:
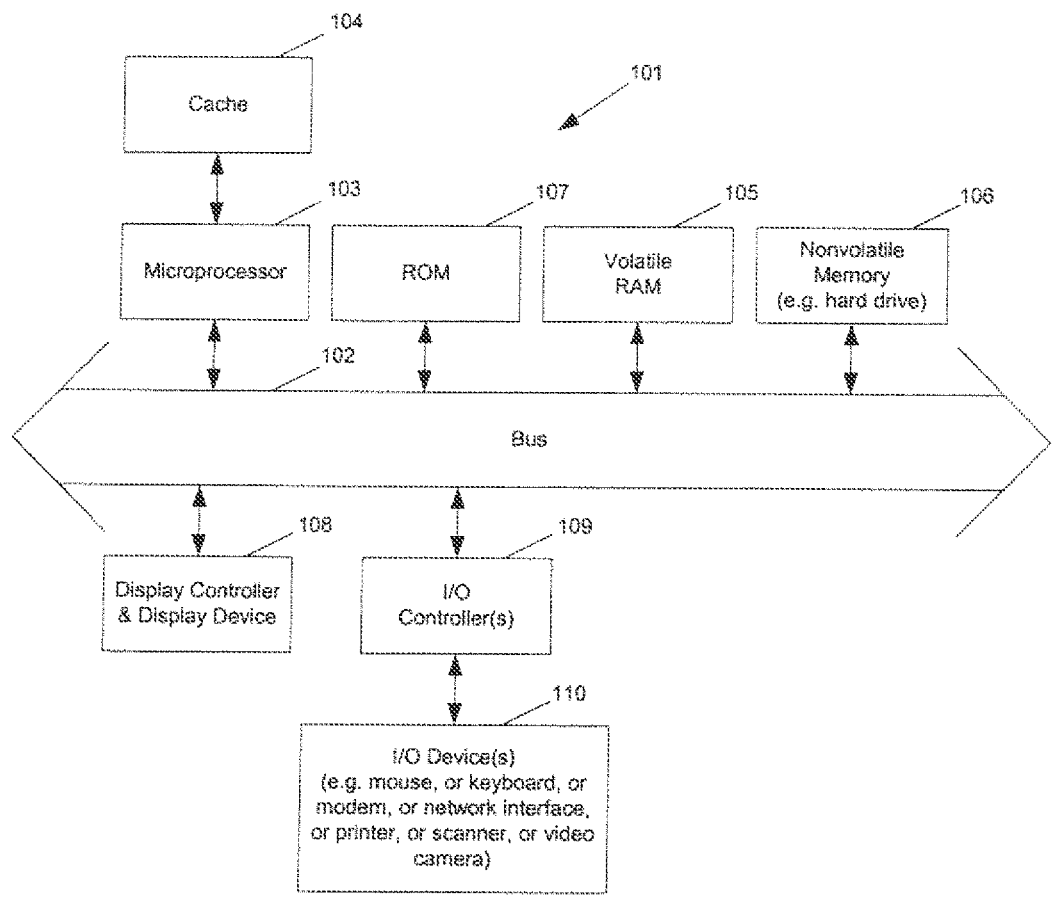
FIG. 1 shows a block diagram example of a data processing system which may be used with the present invention.
Figure 2:
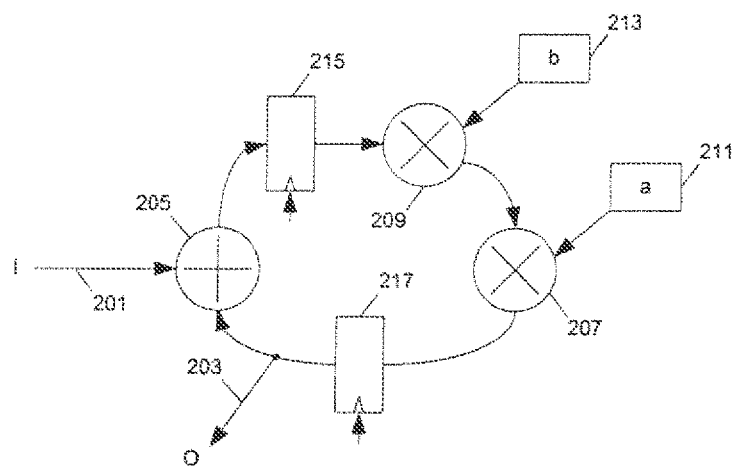
FIGS. 2-3 illustrate a prior art method to construct a data flow graph for retiming.
Figure 3:
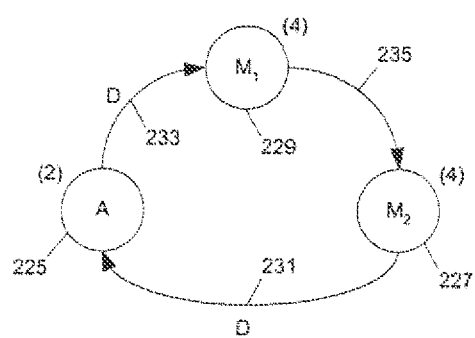

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be a Sun workstation, or a personal computer (PC) running a Windows operating system, or an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103 is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

A typical timing model of a circuit is an aggregation of timing models of combinational computing elements. The timing model of a combinational computing element is independent of the clock period of the circuit. A conventional method aggregates the timing model of the combinational computing elements of the circuit module to generate a timing model of the circuit, which is also independent of the clock period of the circuit.

When timing models are constructed from aggregating the timing models of the combinational computing elements, the number of nodes that represent the combinational computing elements in the resulting data flow graph can be prohibitively high. This kind of a timing model is also often inaccurate, because the intra-module interconnect delays (e.g., the wire delay) are typically ignored. It is also inaccurate because the timing models of the combinational computing elements use pre-implementation estimates of delays.

A typical retiming algorithm has $O(n^3)$ complexity, where n is the number of nodes in the data flow graph, which corresponds to the number of combinational computing elements in a conventional method. Thus, using a gate-level timing model often results in prohibitive computational complexity for system-level retiming, while it may still yield an inaccurate model of the timing behavior of the circuit due to the ignoring of the intra-module interconnect delays, etc. and due to using pre-implementation estimates.

In one embodiment of the present invention, a system-level circuit is produced through combining pre-designed hardware modules; and, a timing model is constructed for each of these modules to improve and speed-up retiming. The timing model according to embodiments of the present invention minimizes the number of nodes used in the data flow graph, while accurately representing the timing behavior of the module for retiming purposes. A simple yet effective timing model for a given hardware module is constructed in a systematic way. In general, a portion of a circuit (e.g., a sub-circuit, or a block of circuit) can also be treated as a circuit module in a similar fashion, for which a simplified timing model can be constructed according to embodiments of the present invention. Thus, the retiming of a circuit for clock period minimization can be performed in a hierarchical fashion according to embodiments of the present invention. In a traditional approach, clock period minimization of a circuit system uses a data flow graph with nodes corresponding to combinational computing elements, each of which has a predetermined design and logic (e.g., a predetermined latency and a predetermined maximum delay). In a hierarchical approach according to at least one embodiment of the present invention, clock period minimization is performed based on timing models for one or more modules (or sub-circuit) of a circuit system, where each timing model of a module is obtained from clock period minimization of the module with multiple design parameters (e.g., different latencies, different design architectures, different minimum clock periods for the module) and the timing model of the module reflects the multiple design parameters. In one embodiment, at least one parameter (e.g., a minimum latency) in the timing model of the module is determined according to a target clock period for the circuit system. More details of embodiments of the present invention are described below.

Some hardware modules (e.g., an FIR filter), and sub-circuits in general, are capable of trading latency for speed. In other words, it may be possible to improve the speed of a hardware module to have a reduced clock period by "throwing" registers into the module.

In one embodiment of the present invention, the timing model of a hardware module is constructed using data from a detailed implementation of the model. This data is obtained by: feeding an increasing number of registers into the module; retiming (and optimizing) the hardware module; and detecting the critical path within the module as new registers are added to determine the minimum clock period of the module.

In one embodiment of the present invention, the minimum clock period of the module is obtained from a detailed design layout (e.g., using a timing analysis after placement and routing).

The clock speed of the output design can be maximized, e.g. by applying a known retiming algorithm for clock period minimization ("VLSI Digital Signal Processing Systems: Design and Implementation" by Keshab K. Parhi, pp. 100-106, Wiley-Interscience, 1999). These retiming algorithms are formulated on data flow graphs. Hardware modules, often containing registers and memories, do not directly fit in as single nodes. Thus, they are translated into a combination of nodes and edges in order to sufficiently represent their timing behavior. In order not to burden the optimization algorithm with too many nodes and edges, the translation/modeling according to one embodiment of the present invention yields as few nodes and edges as possible to provide a very simple yet sufficient timing model. Detailed examples are described below to show the methods for systematically translating from hardware module designs into combinations of nodes and edges.

Figure 4:
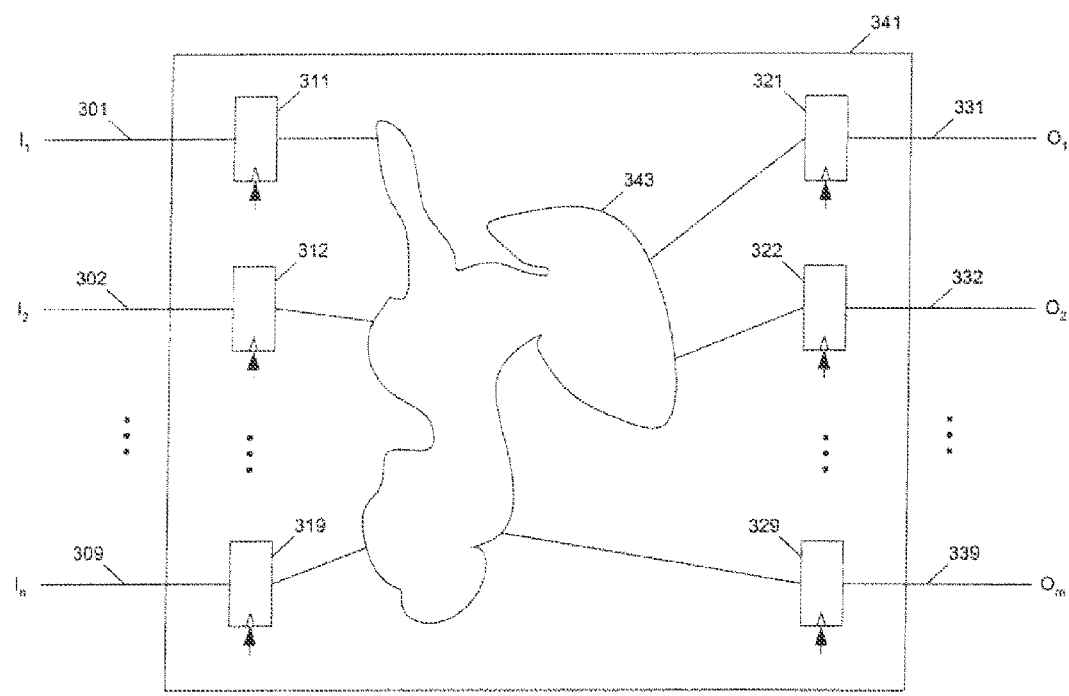
FIGS. 4-5 illustrate an example to construct a data flow graph for a circuit module with registered I/O according to one embodiment of the present invention.
Figure 5:
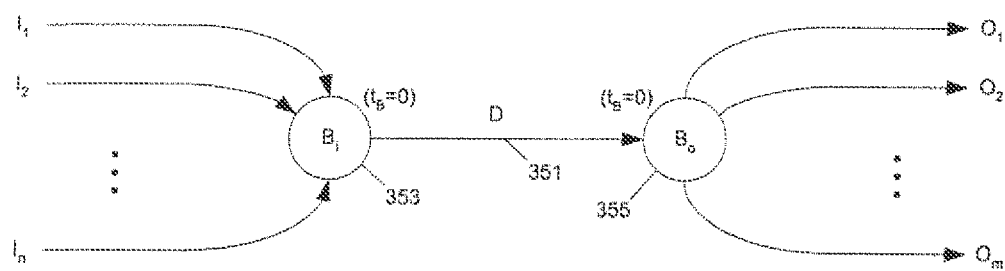

FIGS. 4-5 illustrate an example to construct a data flow graph for a circuit module with registered I/O according to one embodiment of the present invention. FIG. 4 illustrates a hardware module with n registered input and m registered output, in which input $I_1$ (301), $I_2$ (302), ..., $I_n$ (309) are direct inputs for registers 311, 312, ..., and 319 respectively and output $O_1$ (331), $O_2$ (332), ..., and $O_m$ (339) are direct outputs from registers 321, 322, ..., 329. Logic 343 represents a network of logic elements for computing outputs 331-339 from input 301-309 for module 341. Let $c_i$ denote the delay along the critical path within the module when i extra sets of pipeline registers have been "thrown" (e.g., pipelining using any known algorithms, or inserting registers by a designer, or using an alternative design for the module by a designer according to the modified specification for the module) into the hardware module. A set of pipeline registers is a set of registers that are on a feed forward cutset of the module. A conventional pipelining algorithm can be used to insert one or more sets of pipeline registers. The values $\{c_0, c_1, \ldots, c_L\}$ can be computed by any known methods, where L is the maximum number of sets of inserted pipeline registers. It is understood that in general $c_0 > c_1, > \ldots, > c_L$, since retiming or optimization is performed to minimize the critical path delay after the pipeline registers are inserted. In one embodiment of the present invention, the delay along the critical path can be computed from a timing analysis after the module is placed and routed. However, delay can also be estimated using typical methods for a synthesis tool, although such delay estimations are in general less accurate than those obtained from timing analysis after the placement and routing. A timing model according to one embodiment of the present invention contains the set of values $\{c_0, c_1, \ldots, c_L\}$ and a data flow graph representation as shown in FIG. 5.

In FIG. 5, computation nodes $B_i$ (353) and $B_o$ (355) have zero computation time. There is at least one delay on edge 351; thus, edge 351 cannot be a part of a critical path. From this description, it will be apparent that the number of delays on edge 351 may be set to any number, if the feasibility condition is properly set according to the target clock of the system and the edge is not included as a part of a critical path. If the module with no extra sets of pipeline registers is used in the circuit and the clock of the circuit is such that $c_{(i-1)} > c > c_i$, from the set of values $\{c_0, c_1, \ldots, c_L\}$ it is understood that the module works properly if at least i sets of pipeline registers are inserted into the module. Thus, the feasibility constraint for the graph in FIG. 5 indicates that edge 351 requires i more delays from the retiming operation in order to work properly. Such a constraint is very similar to the feasibility constraint on a typical edge of a data flow graph, which indicates the maximum number of delays that can be moved out of the edge. To use a typical retiming algorithm, the feasibility constraint for edge 351 can be stated as that the maximum number of delays that can be moved out of the edge is –i, if $c_{(i-1)} > c > c_i$.

Thus, a data flow graph representation of the module (341) with registered I/O has two nodes $B_i$ (353) and $B_o$ (355), and an edge (351) connecting these two nodes. The computation times of these nodes are 0. The feasibility constraint for the edge depends on the clock period of the circuit. When the module is used as a component of a larger design, the timing model can be utilized in retiming as follows.

1. Use the data flow graph in FIG. 5 to represent the module in creating the data flow graph for the entire design.

2. Let c be the clock period that is targeted for the entire design. If $c < c_L$, it can be concluded that a target clock period of c is not feasible for the design, assuming that adding (L+1) sets of pipeline registers into the module cannot reduce the minimum clock period of the module below $c_L$.

3. If $c \le c_L$, determine the feasibility condition for edge 351. For example, if $c_i < c < c_{(i-1)}$, where i=1, 2, ..., L, at least i additional delays are required for the edge. If $c > c_0$, no additional delays are required for the edge. A known algorithm can then be used to retime the entire design using the data flow graph. For example, in the retiming algorithm of "VLSI Digital Signal Processing Systems: Design and Implementation" by Keshab K. Parhi, pp. 91-118, Wiley-Interscience, 1999, values $r(B_i)$ and $r(B_o)$ are solved for nodes $B_i$ and $B_o$ so that after retiming the number of delays on edge 351 changes from w to $w_r = w + r(B_o) - r(B_i)$. Thus, the feasibility condition for edge 351 can be: $r(B_i) - r(B_o) < -i$, if $c_i < c < c_{(i-1)}$; $r(B_i) - r(B_o) < 0$ if $c > c_0$; and, not feasible, if $c < c_L$.

4. If a feasible retiming solution is found, add $r(B_o) - r(B_i)$ sets of pipeline registers to the module during module instantiation.

Note that the example illustrated in FIGS. 4 and 5 shows a situation where one or more sets of pipeline registers are "thrown" into the module through all the input lines (or all the output lines) of the module. However, it is understood that the clock period of the module can also be minimized by "throwing" in registers through one or a subset of input (or output) lines of the module. For example, the clock period of the module in FIG. 4 may be reduced through adding one register to input $I_1$ (301) and retiming the modified module to minimize the clock period. To reflect such changes in latency through retiming a portion of the input and/or output lines, a more general data flow graph for a module with registered I/O can include zero-processing-time nodes connecting between input $I_1, I_2, \ldots, I_n$ and $B_i$ and between output $O_1, O_2, \ldots, O_m$ and $B_o$. Each of the edges connecting these zero-processing-time nodes to $B_i$ and $B_o$ has at least one delay and requires a number of extra delays to indicate the corresponding number of registers "thrown" in through the corresponding input or output line of the module. Alternatively, when a same number of registers are "thrown" into a subset of the input lines, these input lines can be connected to one single zero-processing-time node, which is then connected to node $B_i$ through an edge which requires at least the same number of delays in retiming for the entire system. The portions of input and output that can be independently retimed determine the timing model topology. Allowing more independence results in more complex model. Further, different models can be constructed for "throwing" in the same number of registers. From this description, it will be appreciated that many variations of simplified data flow graphs can be constructed based on retiming a module with different latencies. The feasibility conditions are established according to the target clock of the circuit system.

When the input and/or output of the module are not registered, the timing model according to one embodiment of the present invention also takes into account: 1) the maximum delay from the input to any module-internal registers for each non-registered input; 2) the maximum delay from any module-internal registers to the output for each non-registered output; 3) the maximum input-to-output delay on any purely combinatorial path for each input-output pair. It is understood that a purely combinatorial path contains no clocked register.

Note that these maximum delay values can be dependent on the number of added sets of pipeline registers, and thus the target clock period, just like the feasibility condition is.

Figure 6:
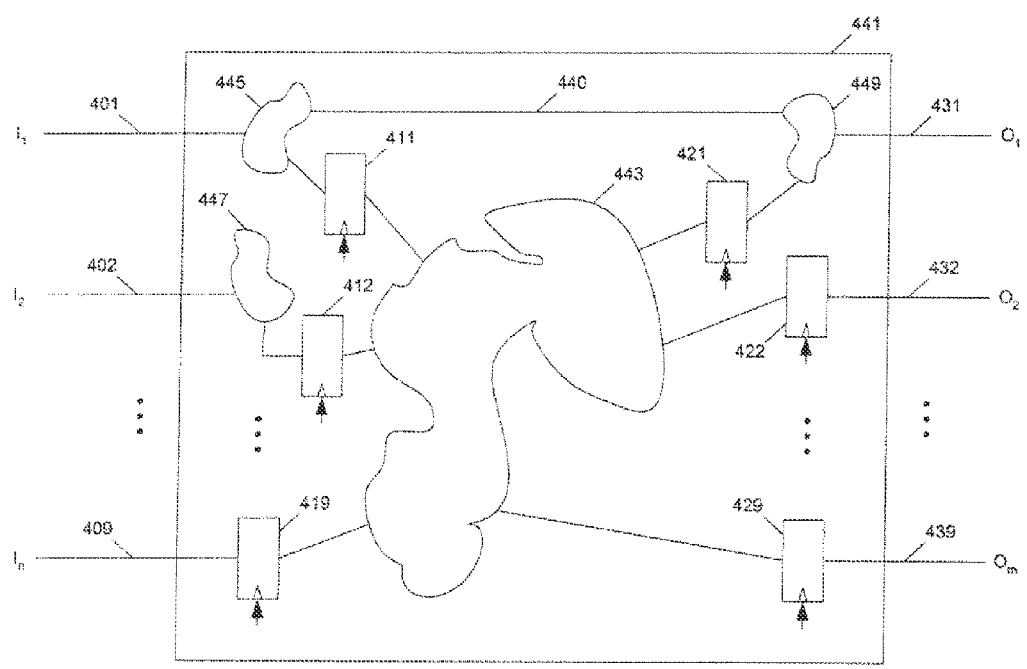
FIGS. 6-7 illustrate an example to construct a data flow graph for a circuit module with non-registered I/O according to one embodiment of the present invention.
Figure 7:
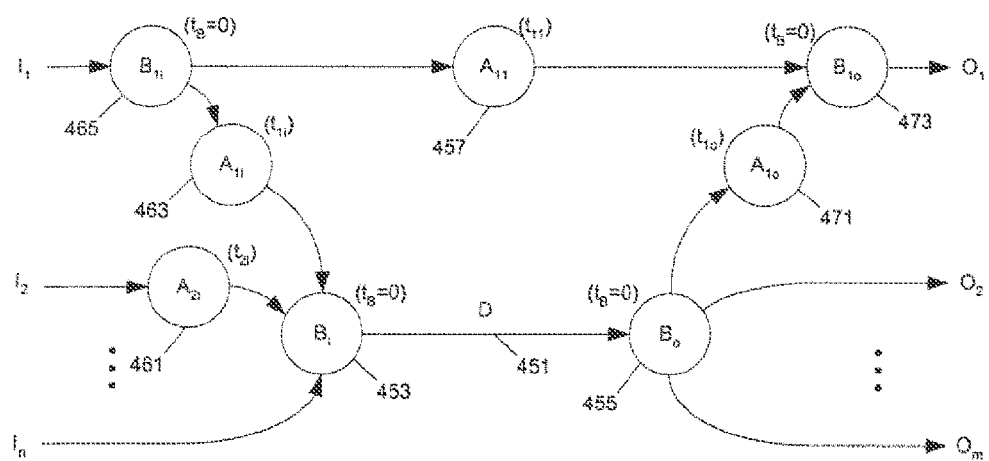

FIGS. 6-7 illustrate an example to construct a data flow graph for a circuit module with non-registered I/O according to one embodiment of the present invention. In FIG. 6, input 401 and 402 are not registered; output 431 is not registered; and, there is at least one purely combinatorial path from input 401 to output 431. Networks 445, 447 and 449 represent purely combinatorial networks, which have no registers.

FIG. 7 shows one example of a data flow graph for module 441 according to one embodiment of the present invention. In FIG. 7, nodes 453 and 455 and edge 451 represent the registered portion of module 441, which includes all paths between registers 411-419 and registers 421-429 through network 443. Node $A_{2i}$ (461) represents the paths between input $I_2$ (402) and register 412; node $A_{1i}$ (463) represents the paths between input $I_1$ (401) and register 411; node $A_{1o}$ (471) represents the paths between register 421 and output $O_1$ (431); and, node $A_{11}$ (457) represents the paths between input $I_1$ (401) and output $O_1$ (431) through net 440. Node $B_{1i}$ (465) facilitates the proper connectivity for nodes $A_{1i}$ (463) and $A_{11}$ (457) to input $I_1$. Similarly, node $B_{1o}$ (473) connects nodes $A_{11}$ (457) and $A_{1o}$ (471) to output $O_1$. In FIG. 7, since nodes $B_{1i}$, $B_{1o}$, $B_i$ and $B_o$ are used for facilitating the connectivity, these nodes have a processing time of zero; since nodes $A_{2i}$, $A_{1i}$, $A_{11}$ and $A_{1o}$ represent the purely combinatorial paths, each of these nodes has a processing time that is equal to the maximum delay among all the paths represented by the node. For example, $A_{1i}$ (463) has a processing time equal to the maximum delay from input $I_1$ (401) to register 411; $A_{2i}$ (461) has a processing time that is equal to the maximum delay from input $I_2$ (402) to register 412; $A_{1o}$ (471) has a processing time that is equal to the maximum delay from register 421 to output $O_1$ (431); and, $A_{11}$ (457) has a processing time that is equal to the maximum combinatorial delay from input $I_1$ (401) to output $O_1$ (431) (through net 440).

Figure 8:
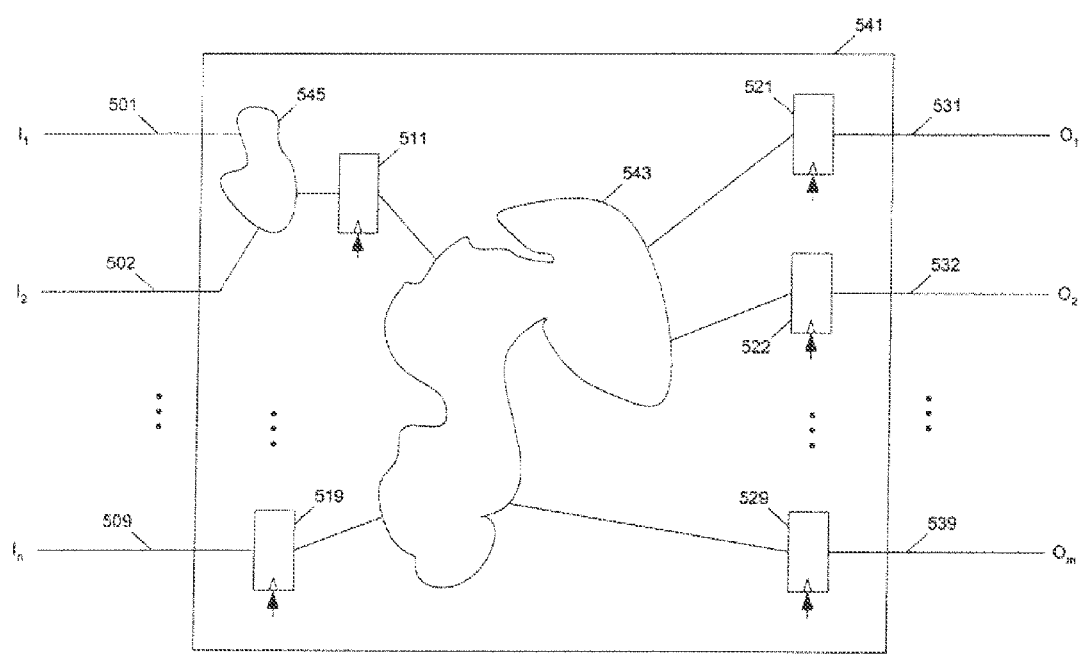
FIGS. 8-9 illustrate another example to construct a data flow graph for a circuit module with non-registered I/O according to one embodiment of the present invention.
Figure 9:
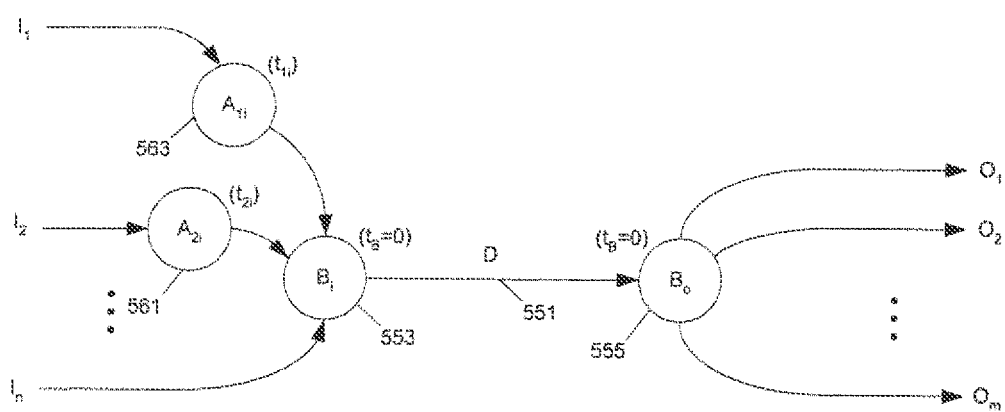

It is understood that, in general, an input to a register of a module can be a result from one or more input of the module. Similarly, an output from a register of a module can contribute to more than one output of the module. FIGS. 8-9 illustrate another example to construct a data flow graph for a circuit module with non-registered I/O according to one embodiment of the present invention. In FIG. 8, both input $I_1$ (501) and $I_2$ (502) have one or more purely combinatorial paths that lead to register 511. Network 545 contains no registers. All combinatorial paths between input $I_1$ (501) and register 511 are represented by node $A_{1i}$ (563) in FIG. 9; and, all combinatorial paths between input $I_2$ (502) and register 511 are presented by node $A_{2i}$ (561) in FIG. 9. In FIG. 9, the processing time of $A_{1i}$ (563) and $A_{2i}$ (561) are the maximum delay from input $I_1$ (501) and $I_2$ (502) respectively to register 511 through combinatorial network 545.

Similar to a module with registered I/O, the clock period of a module with non-registered I/O can also be reduced by "throwing" in registers through a portion of the input and output lines. Such addition of latencies for a portion of the input and output lines can be specified on edges connected to nodes that represent the registered portion of the module (e.g., nodes $B_i$ 533 and $B_o$ 555), in a way similar to those described above for the modules with registered I/O.

Further, it is understood that, in general, an input for a module may have combinatorial paths to different registers; and, an output of the module may have contributions from multiple registers through a purely combinatorial network. In general, a single node can be used to represent all the paths which do not have registers and each of which is from one input of the module to any register of the module; and, the computation time for the single node is the maximum delay among all the paths represented by the node. Similarly, a single node can be used to represent all the paths which do not have registers and each of which is from any register of the module to one output of the module. Further, a single node can be used to represent all the paths which do not have registers and each of which is from one input of the module to one output of the module.

FIGS. 10-16 illustrate a detailed example to design a circuit module according to one embodiment of the present invention.

Figure 10:
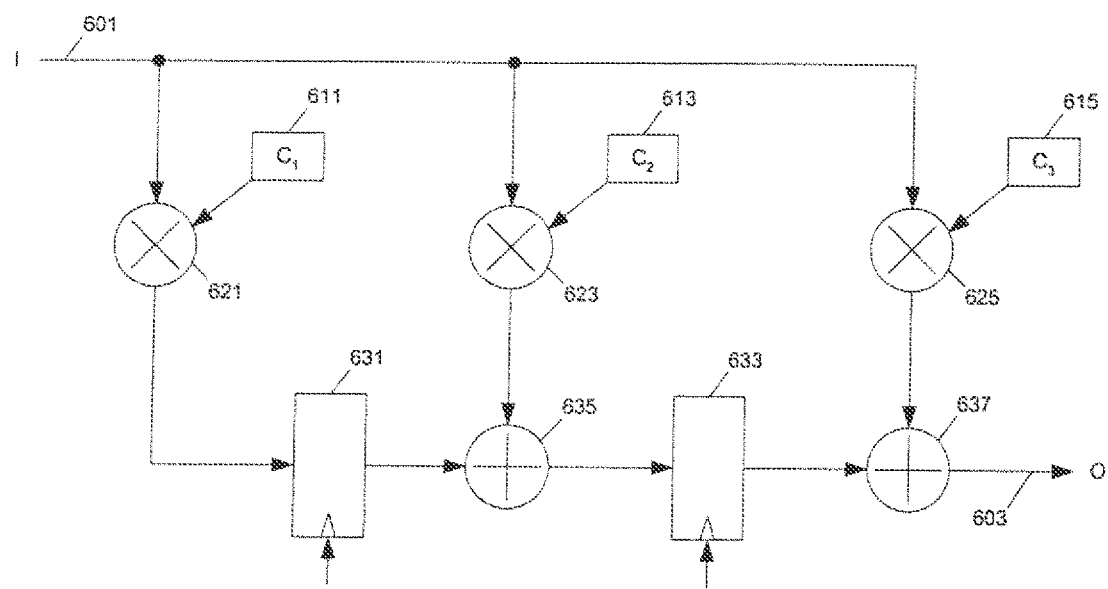
FIGS. 10-16 illustrate a detailed example to design a circuit module according to one embodiment of the present invention.
Figure 11:
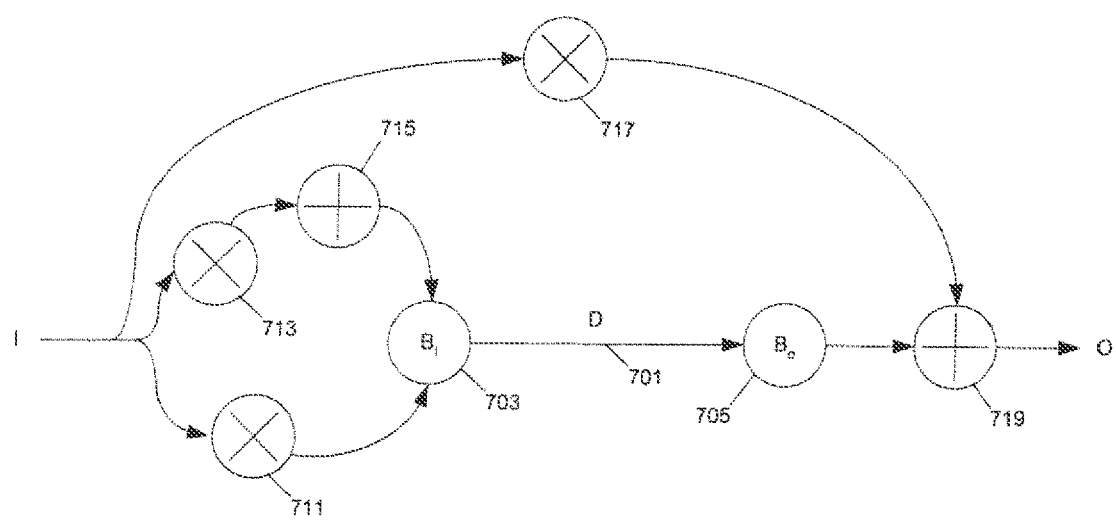
Figure 12:
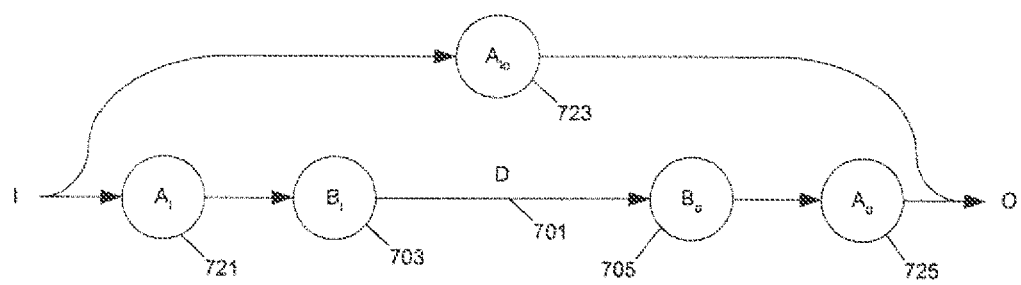

FIG. 10 illustrates a module with a minimum latency; and, FIG. 11 illustrates a data flow graph for the module in FIG. 10 according to one embodiment of the present invention. In FIG. 11, node $B_i$ (703), edge 701 and node $B_o$ (705) represent all the paths between registers of FIG. 10 (e.g., from register 631 through adder 635 to register 633 in FIG. 10). Node 711 represents multiplier 621; nodes 713 and 715 represent multiplier 623 and adder 635; and, nodes 717 and 719 represent multiplier 625 and adder 637. Note that there are two paths from input I to node 703 in FIG. 11, which represent different combinatorial paths from input I (601) to internal registers 631 and 633 of the module in FIG. 10. These paths can be represented by a single node, which has a processing time that is equal to the longest delay on the paths. FIG. 12 illustrates such a representation of a data flow graph, in which node $A_i$ (721) represents the longest combinatorial delay from input I to any internal register of the module in FIG. 10. In one exemplary embodiment, a representation of a data flow graph includes nodes (representing logic) and links between the nodes. Further, node 723 represents the longest delay from input I (601) to output O (603) through any combinatorial path, which is the delay on the path through multiplier 625 and adder 637. Node $A_o$ (725) represents the path from register 633 through adder 637 to output O (603). Note that nodes 703 and 705 have zero processing time and the edges between nodes 721 an 703 and between nodes 705 and 725 have no delay; thus, nodes 703 and 705 can be merged into nodes 721 and 725 respectively (since nodes $B_i$ (703) and $B_o$ (705) in FIG. 12 are redundant in this example). After identifying the critical path of the module in FIG. 10, the minimum clock period $C_0$ is determined for the module.

Figure 13:
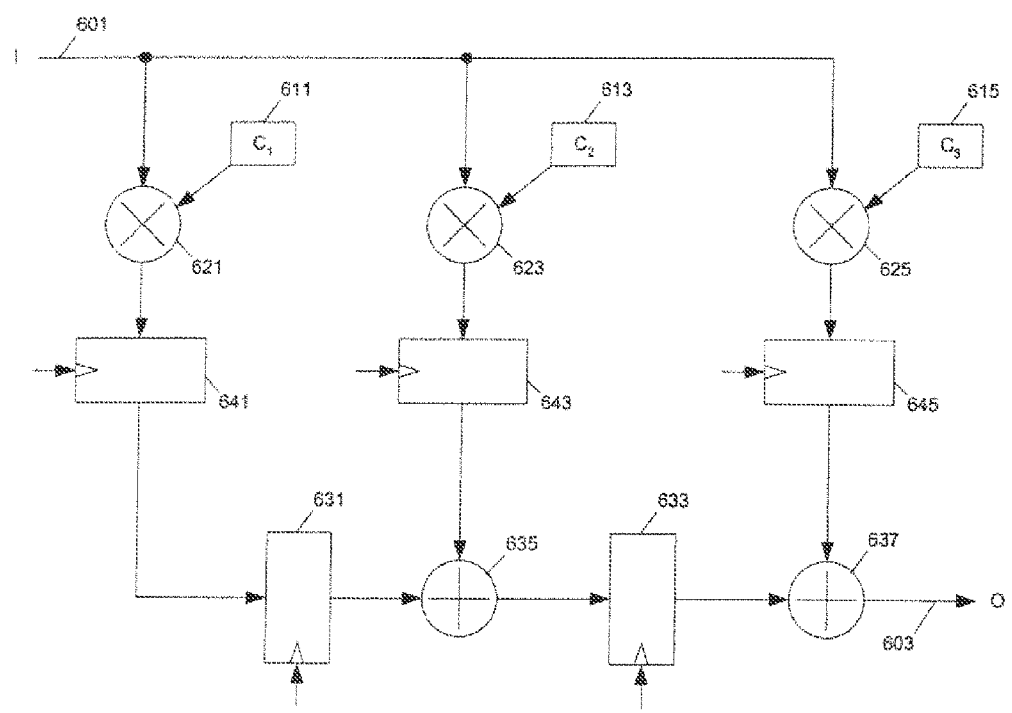
Figure 14:
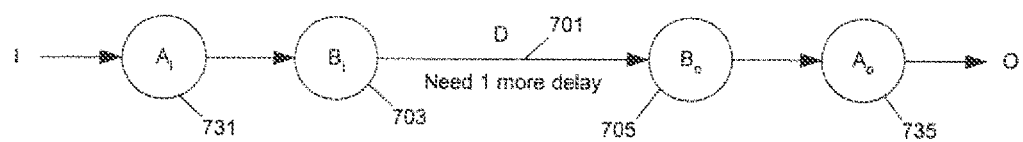

When the module in FIG. 10 is allowed one extra clock cycle of latency, a pipeline register set can be added (e.g., registers 641, 643 and 645 in FIG. 13). Retiming and optimization can be performed to minimize the clock period for the module with one extra clock cycle of latency (e.g., to generate the design in FIG. 13). A data flow graph as shown in FIG. 14 can then be constructed for the module in FIG. 13. In FIG. 14, node 731 represents the paths from input 601 through multipliers 621, 623 and 625; and node 735 represents the paths from registers 633 and 645 through adder 637 to output 603.

Relative to the module in FIG. 10, the module in FIG. 13 requires one extra set of pipeline registers (one extra clock cycle of latency; thus, edge 701 in the data flow graph in FIG. 14 requires 1 more delay relative to edge 701 in the data flow graph in FIG. 12. After identifying the critical path of the module in FIG. 13, the minimum clock period $C_1$ is determined for the module with one extra clock cycle of latency. Note that since nodes $B_i$ (703) and $B_o$ (705) in FIG. 14 are redundant in this example, they can also be eliminated.

Figure 15:
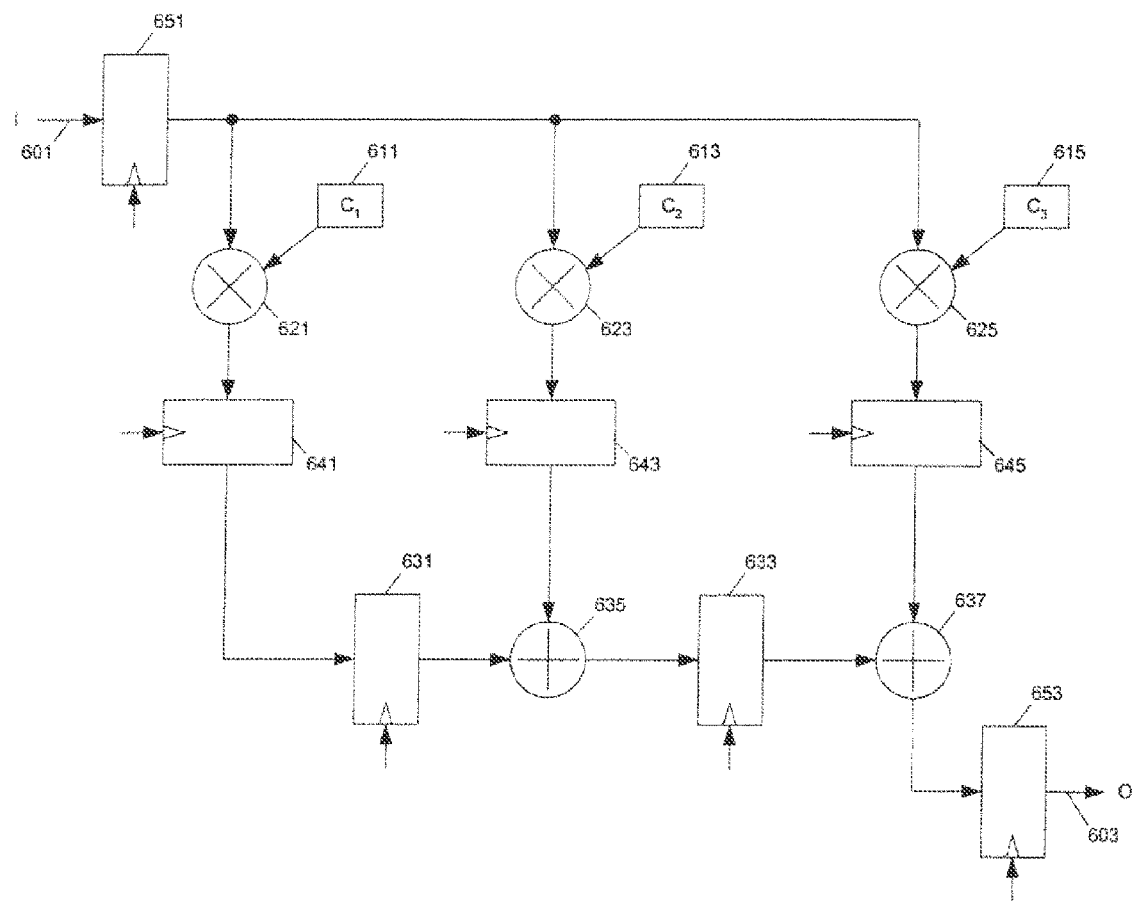

When registers 651, 653 and registers 641, 643 and 645 are added into the module as shown in FIG. 15, the module becomes a module with registered I/O. Thus, the module in FIG. 15 can be represented by the data flow graph in FIG. 16. Edge 701 in FIG. 16 requires 3 more delays relative to edge 701 in FIG. 12. Similarly, after identifying the critical path of the module in FIG. 15, the minimum clock period $C_3$ is determined for the module with three extra clock cycles of latency.

Figure 16:
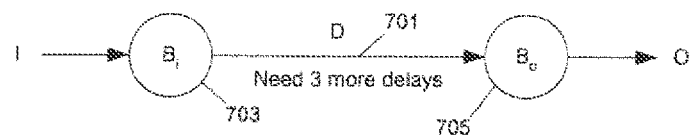

The data flow graphs in FIGS. 12, 14 and 16 can be selectively used according to the target clock period c in retiming the circuit that contains the module. For example, when the module in FIG. 10 is used in a circuit and when $C_1<C<C_0$, it is understood that at least one extra clock cycle of latency is required to be "thrown" into the module; and thus, the data flow graph in FIG. 14 is used for retiming for clock minimization of the entire circuit; and, the feasibility condition for edge 701 in FIG. 14 is that edge 701 needs 1 more delay (or the maximum delays that can be taken out of edge 701 is −1). However, if the module in FIG. 13 is used in the circuit and $C>C_0$, it is understood that one extra latency may be moved out of the module; and thus, the data flow graph in FIG. 12 can be used; and the feasibility condition for edge 701 FIG. 12 is that at most one delay can be moved out of edge 701.

When an IP module is used in a design, the user may specify the amount of latency to be used in the IP module. Thus, the design that is input to a retiming optimization engine may have an IP module with a latency that is greater than the minimum required latency for that IP module. For example, the input design may contain an FIR filter module having two pipeline registers. When the original specified latency of a module is larger than the minimum possible latency, the extra latency is considered in the construction of the constraint for the data flow graph of the module. For example, the feasibility condition can be adjusted to indicate the extra latency that can be transferred into another part of the circuit if needed. Note that alternative approaches can also be used. For example, the extra latencies can be specified as the movable weights (delays) on the edges that are originating from the output (or input) ports of the module.

Figure 17:
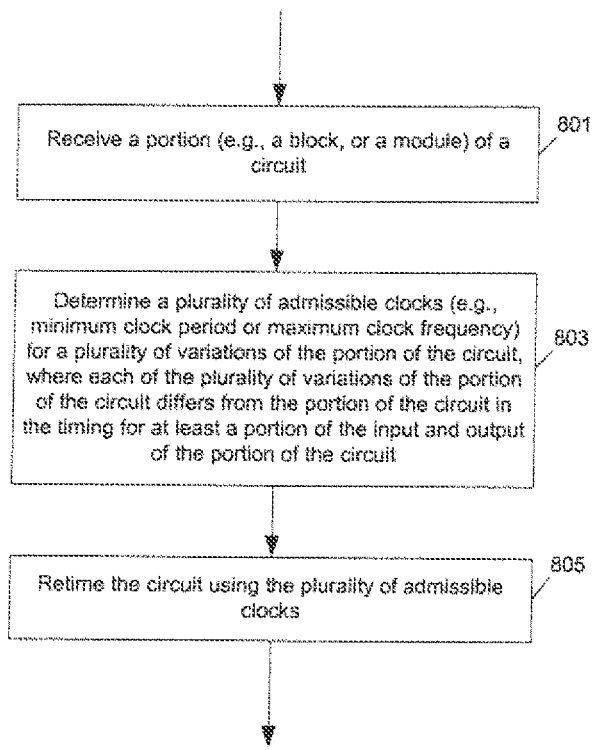
FIG. 17 shows a method to retime a circuit according to one embodiment of the present invention.

FIG. 17 shows a method to retime a circuit according to one embodiment of the present invention. After operation 801 receives a portion (e.g., a block, or a module) of a circuit, operation 803 determines a plurality of admissible clocks (e.g., minimum clock period or maximum clock frequency) for a plurality of variations of the portion of the circuit, where each of the plurality of variations of the portion of the circuit differs from the portion of the circuit in the timing for at least a portion of the input and output of the portion of the circuit. For example, a variation of the portion of the circuit is equivalent to adding one or more registers (with positive or negative latency) to at least a portion of the input and output lines of the portion of the circuit and performing retime for the portion of the circuit. Operation 805 retimes the circuit using the plurality of admissible clocks. For example, the minimum number of latency (delay) that must be "thrown" into the module (e.g., through a portion of the input and output lines) is determined from the plurality of admissible clocks and the target clock of the circuit.

Figure 18:
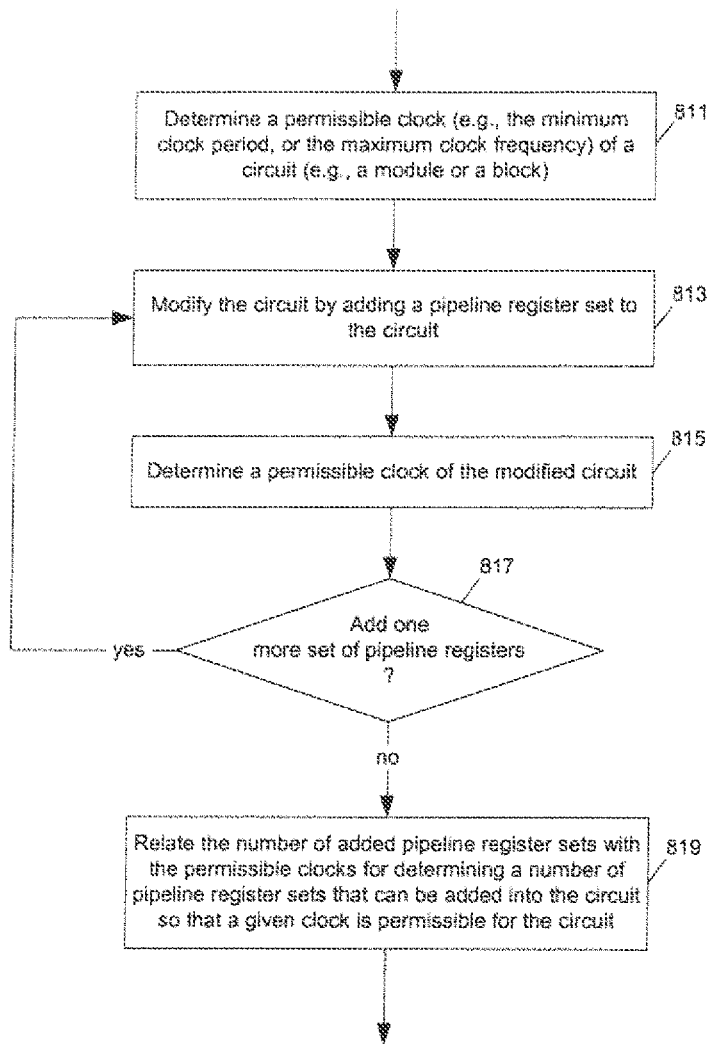
FIG. 18 shows a method to design a circuit module according to one embodiment of the present invention.

FIG. 18 shows a method to design a circuit module according to one embodiment of the present invention. Operation 811 determines a permissible clock (e.g., the minimum clock period, or the maximum clock frequency) of a circuit (e.g., a module or a block). Operation 813 modifies the circuit by adding a pipeline register set to the circuit. Alternatively, a set of registers can be "thrown" into the module through a portion of the input and output lines of the module (e.g., adding registers to the portion of the input and output lines and retiming to optimize the module with the added registers). Operation 815 determines a permissible clock of the modified circuit. If operation 817 determines one more set of pipeline registers is to be added to reduce the clock of the module (or more registers can be "thrown" into the module to minimize the clock period of the module), operations 813 and 815 are repeated to obtain different variations of the module. Operation 819 relates the number of added pipeline register sets with the permissible clocks for determining a number of pipeline register sets that can be added into the circuit so that a given clock is permissible for the circuit. Thus, when the model is used in a design, the minimum number of pipeline register sets that can be added into the circuit to make a target clock feasible can be determined. Alternatively, the minimum number of registers that can be "thrown" into the module through a portion of the input and output lines of the module can be determined from the relation between the variations of the module and the corresponding minimum clock periods. Different number of registers can be "thrown" into the module through different portions of the input and output lines of the module for clock minimization; and, the minimum number of registers that can be "thrown" into the module to achieve a target clock for the circuit may then be determined from the correlation between the number of registers "thrown" into the module and the corresponding minimum clock periods.

Figure 19:
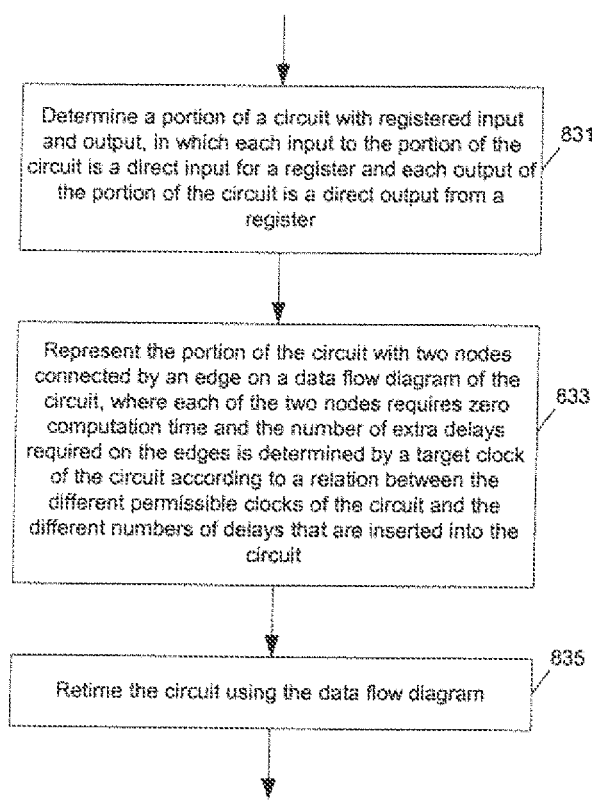
FIG. 19 shows a method to retime a circuit with a module with registered I/O according to one embodiment of the present invention.

FIG. 19 shows a method to retime a circuit with a module with registered I/O according to one embodiment of the present invention. Operation 831 determines a portion of a circuit with registered input and output, in which each input to the portion of the circuit is a direct input for a register and each output of the portion of the circuit is a direct output from a register. Operation 833 represents the portion of the circuit with two nodes connected by an edge on a data flow graph of the circuit, where each of the two nodes requires zero computation time and the number of extra delays required on the edges is determined by a target clock of the circuit according to a relation between the different permissible clocks of the circuit and the different numbers of delays that are inserted into the circuit. Note that the relation between the different permissible clocks of the circuit and the different numbers of delays can be determined before the starting of the retiming of the circuit at the system level or during the process of retiming the circuit at the system level. Operation 835 retimes the circuit using the data flow graph.

Figure 20:
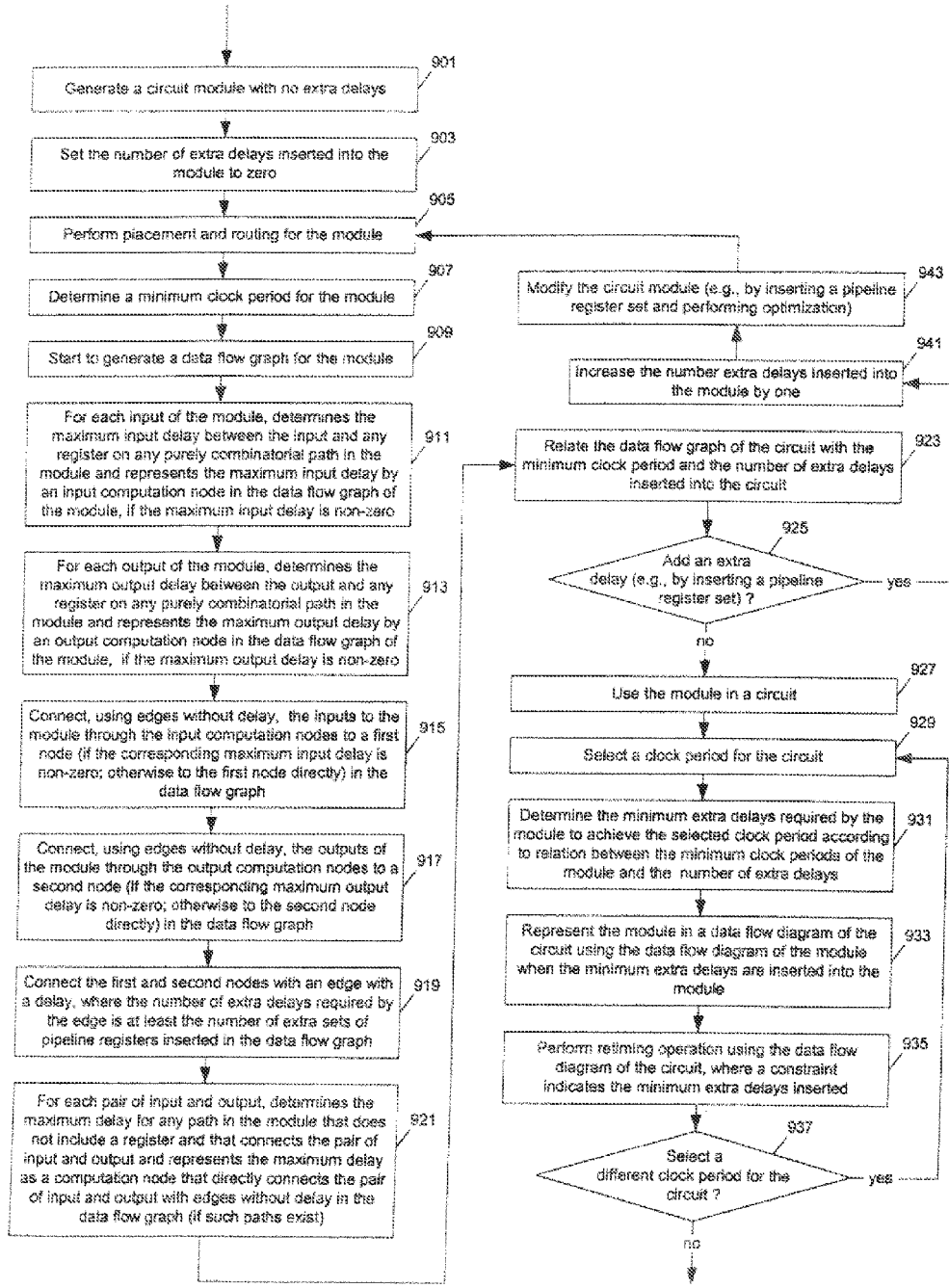
FIG. 20 shows a detailed method to design a circuit according to one embodiment of the present invention.

FIG. 20 shows a detailed method to design a circuit according to one embodiment of the present invention. Operation 901 generates a circuit module with no extra delays. Operation 903 sets the number of extra delays inserted into the module to zero. Operation 905 performs placement and routing for the module. Operation 907 determines a minimum clock period for the module (e.g., from a static timing analysis or a timing simulation). Operation 909 starts to generate a data flow graph for the module. For each input of the module, operation 911 determines the maximum input delay between the input and any register on any purely combinatorial path in the module and represents the maximum input delay by an input computation node, which has a computation time that is equal to the maximum input delay, in the data flow graph of the module (if the maximum input delay is non-zero). For each output of the module, operation 913 determines the maximum output delay between the output and any register on any purely combinatorial path in the module and represents the maximum output delay by an output computation node, which has a computation time that is equal to the maximum output delay, in the data flow graph (if the maximum output delay is non-zero). Operation 915 connects, using edges without delay, the inputs to the module through the input computation nodes to a first node in the data flow graph (if the corresponding maximum input delay is non-zero; otherwise to the first node directly). Operation 917 connects, using edges without delay, the outputs of the module through the output computation nodes to a second node in the data flow graph (if the corresponding maximum output delay is non-zero; otherwise to the second node directly). Operation 919 connects the first and second nodes with an edge with a delay, where the number of extra delays required by the edge is at least the number of extra sets of pipeline registers inserted in the data flow graph. For each pair of input and output, operation 921 determines the maximum delay for any path in the module that does not include a register and that connects the pair of input and output and represents the maximum delay as a computation node that directly connects the pair of input and output with edges without delay in the data flow graph (if such paths exist). Operation 923 relates the data flow graph of the circuit with the minimum clock period and the number of extra delays inserted into the circuit. If operation 925 decides to add an extra delay (e.g., by inserting a pipeline register set), operation 941 increases the number extra delays inserted into the module by one; and, operation 943 modifies the circuit module (e.g., by inserting a pipeline register set and performing optimization). Note that the extra latencies (or delays) can also be "thrown" into to the module through a portion of the input and output lines.

After various designs for variations of the module with different latencies are obtained, operation 927 uses the module in a circuit. Operation 929 selects a clock period for the circuit. Operation 931 determines the minimum extra delays required by the module to achieve the selected clock period according to relation between the minimum clock periods of the module and the number of extra delays. Operation 933 represents the module in a data flow graph of the circuit using the data flow graph of the module when the minimum extra delays are inserted into the module. Operation 935 performs retiming operation using the data flow graph of the circuit, where a constraint indicates the minimum extra delays inserted. The number of minimum extra delays for the module is incorporated into the overall retiming operation in the form of a constraint. For example, the feasibility constraint for an edge of the data flow graph requires that at least the minimum extra delays are to be moved into the edge in the retiming operation (or the number of delays that can be moved out in the retiming operation of the edge is a negative number with a magnitude equals to the minimum extra delays inserted). Operation 937 determines whether or not to select a different clock period for the circuit. For example, if the selected clock period is feasible after the retiming, a reduced clock period may be selected; if no feasible solution is available for the selected clock period for the circuit, the target clock period is increased. Operations 929-935 can be repeated until the clock for the circuit is minimized.

Figure 21:
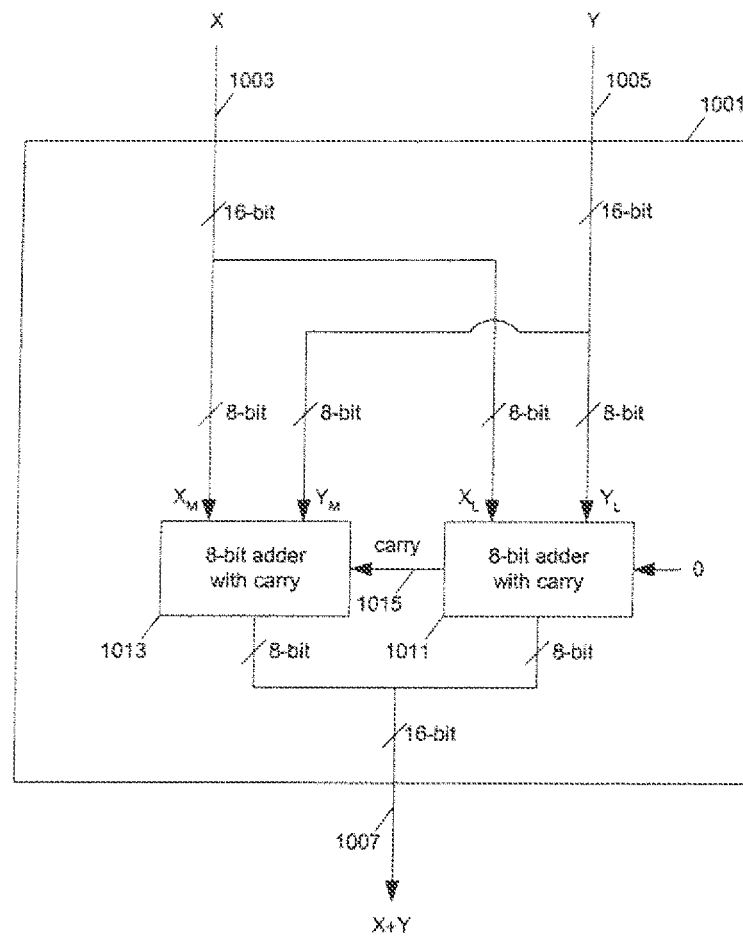
FIGS. 21-23 illustrate examples of a module with different designs for different latencies and minimum clock periods, which can be used according to one embodiment of the present invention.
Figure 22:
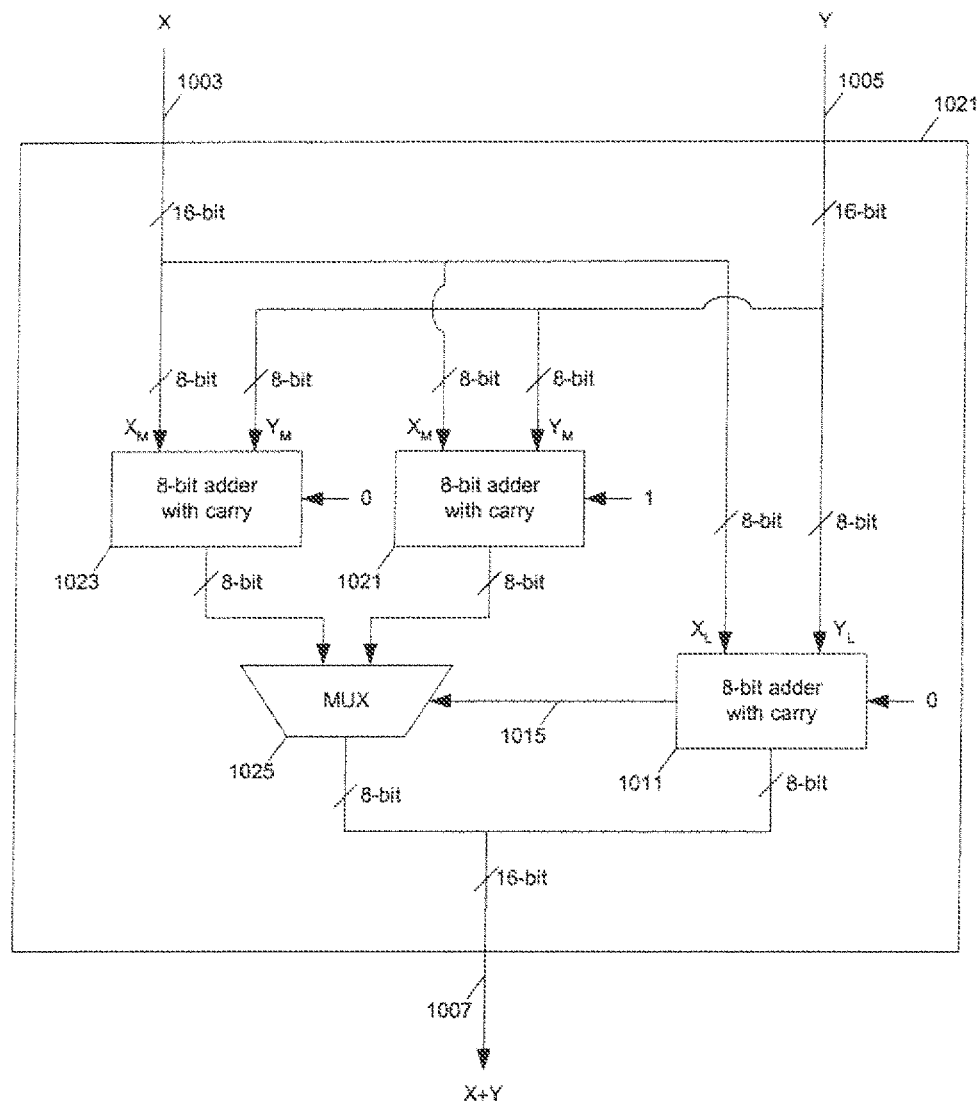
Figure 23:
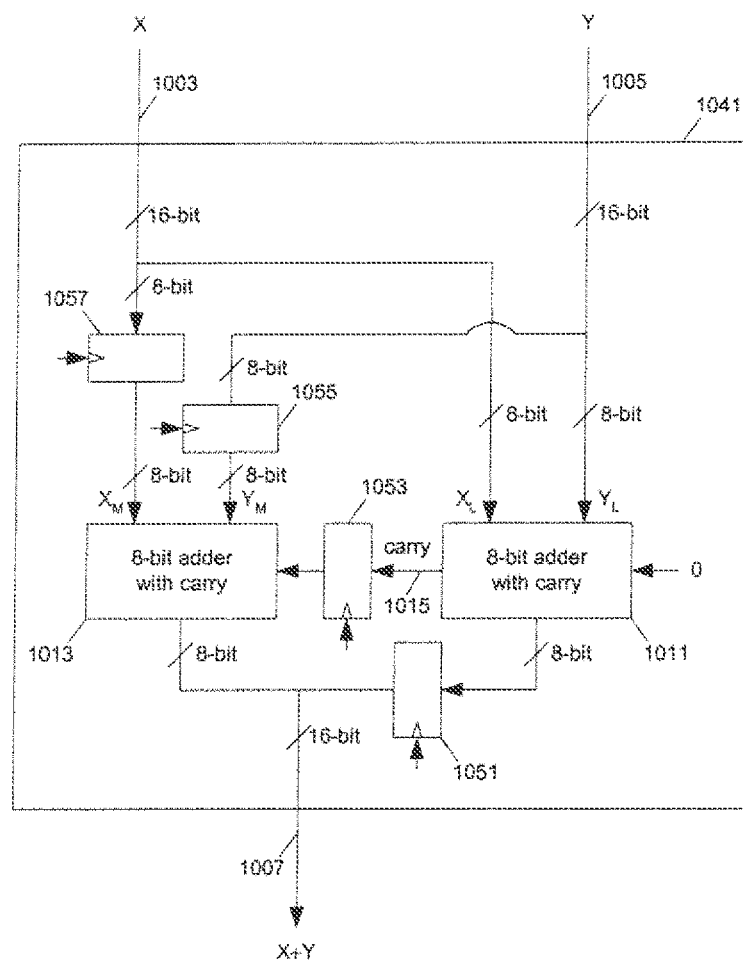

In one embodiment of the present invention, a module has a plurality of designs with different latencies and minimum clock periods (different latencies and speeds). Retiming and optimization can be performed, after registers are added to at least a portion of the input (or output) lines of one module design, to obtain module designs with different latencies and speeds. It is understood that, in general, retiming and optimization do not change the architecture of the module design. However, different design architectures can be used to implement the module in different ways in order to generate module designs with different latencies and speeds; and, a system level algorithm can select among these different designs of different architectures, based on the required speed and latency (and other requirements if exist). When different architectures are used, different designs may include different logic operation elements; and, different designs may have different processing logic. For example, FIG. 21 shows an example design of a 16-bit adder (1001), which includes two 8-bit adders (1011 and 1013). The carry out bit for the sum of the least significant 8-bits ($X_L$ and $Y_L$) of input X (1003) and Y(1005) is input to adder 1013 through line 1015; and, adder 1013 sums the most significant 8-bits ($X_M$ and $Y_M$) of input X (1003) and Y(1005) and the carry out bit from adder 1011. FIG. 22 shows a different design of the 16-bit adder with a different architecture, called carry-select, in which the carry out bit of adder 1011 selects one from the results of adders 1021 and 1023. Adder 1021 sums the most significant 8-bits ($X_M$ and $Y_M$), assuming the carry out bit of adder 1011 is one; and, adder 1023 sums the most significant 8-bits ($X_M$ and $Y_M$), assuming the carry out bit of adder 1011 is zero. The carry-select architecture speeds up the critical path by employing an extra 8-bit adder with carry and a multiplexer (1025). The designs in FIGS. 21 and 22 have the same latency but different speeds. FIG. 23 shows a pipelined version of the design in FIG. 21. Pipeline registers 1051-1057 increase the latency of the design in FIG. 23 by one, relative to the design in FIG. 21. However, the design (1041) in FIG. 23 is faster than the designs (1001 and 1021) in FIGS. 21 and 22. In one embodiment of the present invention, the system level optimization involves selecting one from designs 1001 and 1041 (which have the same architecture), or selecting one from designs 1021 and 1041 (which have different architectures), or selecting one from designs 1001, 1021 and 1041, according to a target clock period. Once the alternative design is selected, the timing model for the selected design can be constructed using various method of the present invention to simplify the timing behavior of the module and to present the register availability conditions.

In one embodiment of the present invention, the signal delays (e.g., on a combinatorial path before or after a register, or on a critical path) are acquired from the full implementation of the module (e.g., after the placement and routing). Thus, the intra-module connectivity delays are included in the simplified timing model, which accurately reflects the timing behavior of the module. These timing models can yield optimal retiming solutions with minimal complexity. While such a model is much simpler than an actual-combinational-component model, it provides a more realistic account of the timing behavior, because the accurate delay data for the intra-module timing behavior (e.g., intra-modular delays such as interconnect delay) are taken into account. As a result, such a timing model yields better accuracy with much less complexity. Better modeling accuracy in timing yields a higher quality final solution.

Unlike a traditional method, a timing model according to embodiments of the present invention is simplistic, effective and accurate for retiming a system level circuit. The simplistic timing model utilizes fewer nodes in the data flow graph, which translates into less computational complexity of system-level retiming. Thus, the simplistic timing model according to embodiments of the present invention can greatly reduce the computational complexity of system-level retiming, while yielding better quality of results.

Further, in one embodiment of the present invention, the "throwing in" of registers can be performed with algorithms that are custom for the specific hardware module. When these custom algorithms are used, the architecture of the hardware module can vary dramatically with latency to generate far better results than that can be achieved through existing general algorithms. The characterization values $\{c_0, c_1, \ldots, c_L\}$ capture this behavior of the custom algorithm.

Although the above examples of simplified models for representing a circuit module are illustrated for the system level of retiming to minimize the clock period, it is understood that this approach can also be used for the optimization involving the area or the power consumption (or other design goals) of a system as well. For example, other attributes, such as power consumption or the area of a circuit, can be added to the simplified model of a circuit module to represent the corresponding properties of the circuit module (e.g., changes in power consumption due to the change of a design of the circuit module); and, the system level optimization can involve these attributes (in addition to the timing constraint). For example, the power consumptions and module area of the designs 1001, 1021 and 1041 in FIGS. 21-23 can be determined. Thus, the change in the power consumption and module area due to the change of design can be evaluated, which can be used in the system level optimization involving the constraint of power consumption and circuit area, clock speed, or a combination of the constraints.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to design a circuit, the method comprising:
   selecting a target clock for a design of the circuit;
   determining a plurality of latencies for a portion of the circuit;
   representing the portion of the circuit by a data flow graph comprising a first node connected with a second node by an edge, the edge connecting the first node and second node representing paths that start from and end in registers in the portion of the circuit, the first node connecting to a third node representing paths between a first input of the portion of the circuit and an input of a register of the portion of the circuit, wherein the second node connects to a fourth node that represents signal delay which is not smaller than signal delay on any path that contains no registers and that is between a first output of the portion of the circuit and an output of a register of the portion of the circuit;
   determining a number of extra delays on the edge of the data flow graph using the target clock for the circuit according to the plurality of latencies for the portion of the circuit, the circuit being greater than the portion; and
   retiming the design for the circuit to operate at the target clock using the representation of the data flow graph, wherein at least one of the selecting, determining, and retiming is performed by a processor.

2. The method of claim 1, wherein the third node represents signal delay which is not smaller than signal delay on any path that contains no registers.

3. The method of claim 1, wherein the data flow graph comprises a fifth node that represents signal delay which is not smaller than signal delay on any path that contains no registers and that connects the first input of the portion of the circuit to a first output of the portion of the circuit.

4. The method of claim 1, wherein said determining the number of extra delays comprises:
   performing retiming on the portion of the circuit according to the target clock.

5. The method of claim 1, wherein said determining the number of extra delays comprises:
   determining the number of extra delays from design data that correlates numbers of extra delays with admissible clocks for the portion of the circuit.

6. The method of claim 1, wherein the portion of the circuit comprises a second input that is a direct input for the register and a first output that is a direct output from the register.

7. The method of claim 1, wherein each of the first node and the second node requires zero computation time.

8. A non-transitory machine readable medium containing executable computer program instructions which when executed by a digital processing system cause said system to perform a method to design a circuit, the method comprising:
   selecting a target clock for a design of the circuit;
   determining a plurality of latencies for a portion of the circuit;
   representing the portion of the circuit by a data flow graph comprising a first node connected with a second node by an edge, the edge connecting the first node and second node representing paths that start from and end in registers in the portion of the circuit, the first node connecting to a third node representing paths between a first input of the portion of the circuit and an input of a register of the portion of the circuit, wherein the second node connects to a fourth node that represents signal delay which is not smaller than signal delay on any path that contains no registers and that is between a first output of the portion of the circuit and an output of a register of the portion of the circuit;
   determining a number of extra delays on the edge of the data flow graph using the target clock for the circuit according to the plurality of latencies for the portion of the circuit, the circuit being greater than the portion; and
   retiming the design for the circuit to operate at the target clock based on the representation of the data flow graph.

9. The non-transitory machine readable medium of claim 8, wherein the third node represents signal delay which is not smaller than signal delay on any path that contains no registers.

10. The non-transitory machine readable medium of claim 8, wherein the data flow graph comprises a fifth node that represents signal delay which is not smaller than signal delay on any path that contains no registers and that connects the first input of the portion of the circuit to a first output of the portion of the circuit.

11. The non-transitory machine readable medium of claim 8, wherein said determining the number of extra delays comprises:
   performing retiming on the portion of the circuit according to the target clock.

12. The non-transitory machine readable medium of claim 8, wherein said determining the number of extra delays comprises:

determining the number of extra delays from design data that correlates numbers of extra delays with admissible clocks for the portion of the circuit.

13. A data processing system to design a circuit, the data processing system comprising:

means for selecting a target clock for a design of the circuit;

means for determining a plurality of latencies for a portion of the circuit;

means for representing the portion of the circuit by a data flow graph comprising a first node connected with a second node by an edge, the edge connecting the first node and second node representing paths that start from and end in registers in the portion of the circuit, the first node connecting to a third node representing paths between a first input of the portion of the circuit and an input of a register of the portion of the circuit, wherein the second node connects to a fourth node that represents signal delay which is not smaller than signal delay on any path that contains no registers and that is between a first output of the portion of the circuit and an output of a register of the portion of the circuit;

means for determining a number of extra delays on the edge of the data flow graph using the target clock for the circuit according to the plurality of latencies for the portion of the circuit, the circuit being greater than the portion; and means for retiming the design for the circuit to operate at the target clock based on the representation of the data flow graph.

14. The data processing system of claim 13, wherein the third node represents signal delay which is not smaller than signal delay on any path that contains no registers.

15. The data processing system of claim 13, wherein the data flow graph comprises a fifth node that represents signal delay which is not smaller than signal delay on any path that contains no registers and that connects the first input of the portion of the circuit to a first output of the portion of the circuit.

16. The data processing system of claim 13, wherein said means for determining the number of extra delays comprises:

means for performing retiming on the portion of the circuit according to the target clock.

17. The data processing system of claim 13, wherein said means for determining the number of extra delays comprises:

means for determining the number of extra delays from design data that correlates numbers of extra delays with admissible clocks for the portion of the circuit.

\* \* \* \* \*